United States Patent
Weldon et al.

(10) Patent No.: US 12,160,971 B2
(45) Date of Patent: Dec. 3, 2024

(54) JAM FOR INTEGRATION RELIABILITY OF RULER FORM FACTOR COMPONENT

(71) Applicant: Intel Corporation, Santa Clara, CA (US)

(72) Inventors: Kristin L. Weldon, Hillsboro, OR (US); Barrett M. Faneuf, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 764 days.

(21) Appl. No.: 17/106,042

(22) Filed: Nov. 27, 2020

(65) Prior Publication Data

US 2021/0084787 A1   Mar. 18, 2021

(51) Int. Cl.
*H05K 7/14* (2006.01)
*G06F 1/18* (2006.01)
*H01R 12/72* (2011.01)
*H01R 13/627* (2006.01)

(52) U.S. Cl.
CPC ........... *H05K 7/1487* (2013.01); *G06F 1/187* (2013.01); *H01R 13/6278* (2013.01); *H05K 7/1489* (2013.01); *H01R 12/72* (2013.01)

(58) Field of Classification Search
CPC .... H05K 7/1487; H05K 7/1489; G06F 1/187; H01R 13/6278; H01R 12/72
USPC ........................................................ 439/377
See application file for complete search history.

(56) References Cited

U.S. PATENT DOCUMENTS

| | | |
|---|---|---|
| 5,403,139 A | 4/1995 | Slivon et al. |
| 5,632,541 A | 5/1997 | Uthoff |
| 6,502,285 B2 | 1/2003 | Kiely |
| 6,550,824 B1 | 4/2003 | Ramsauer |
| 7,255,606 B2 | 8/2007 | Tanaka et al. |
| 7,549,712 B2 | 6/2009 | Booker et al. |
| 9,422,750 B2 | 8/2016 | Gutierrez et al. |
| 10,151,557 B2 | 12/2018 | Sharron et al. |
| 2006/0171110 A1* | 8/2006 | Li .................... G11B 33/128 |
| 2013/0056432 A1* | 3/2013 | Lin .................... A47B 88/43 248/218.4 |

OTHER PUBLICATIONS

Tallis, Billy, "Intel Introduces "Ruler" Server SSD Form-Factor: SFF-TA-1002 Connector, PCIe Gen 5 Ready", AnandTech, downloaded from: https://www.anandtech.com/print/11702/intel-introduces-new-ruler-ssd-for-servers, Aug. 9, 2017, 5 pages.

* cited by examiner

*Primary Examiner* — Gary F Paumen
(74) *Attorney, Agent, or Firm* — Compass IP Law PC

(57) ABSTRACT

An apparatus is described. The apparatus includes an electronic component to be plugged into an electronic system. The electronic component includes a housing. The housing includes a jam. The jam is to push through a first opening in a bottom of the housing and a second opening in a surface when the first and second openings are at least partially aligned. The surface is a mechanical component of the electronic system that the electrical component is to slide upon when being plugged into the electronic system. The jam includes tooth edges to engage with an edge of the second opening.

20 Claims, 12 Drawing Sheets

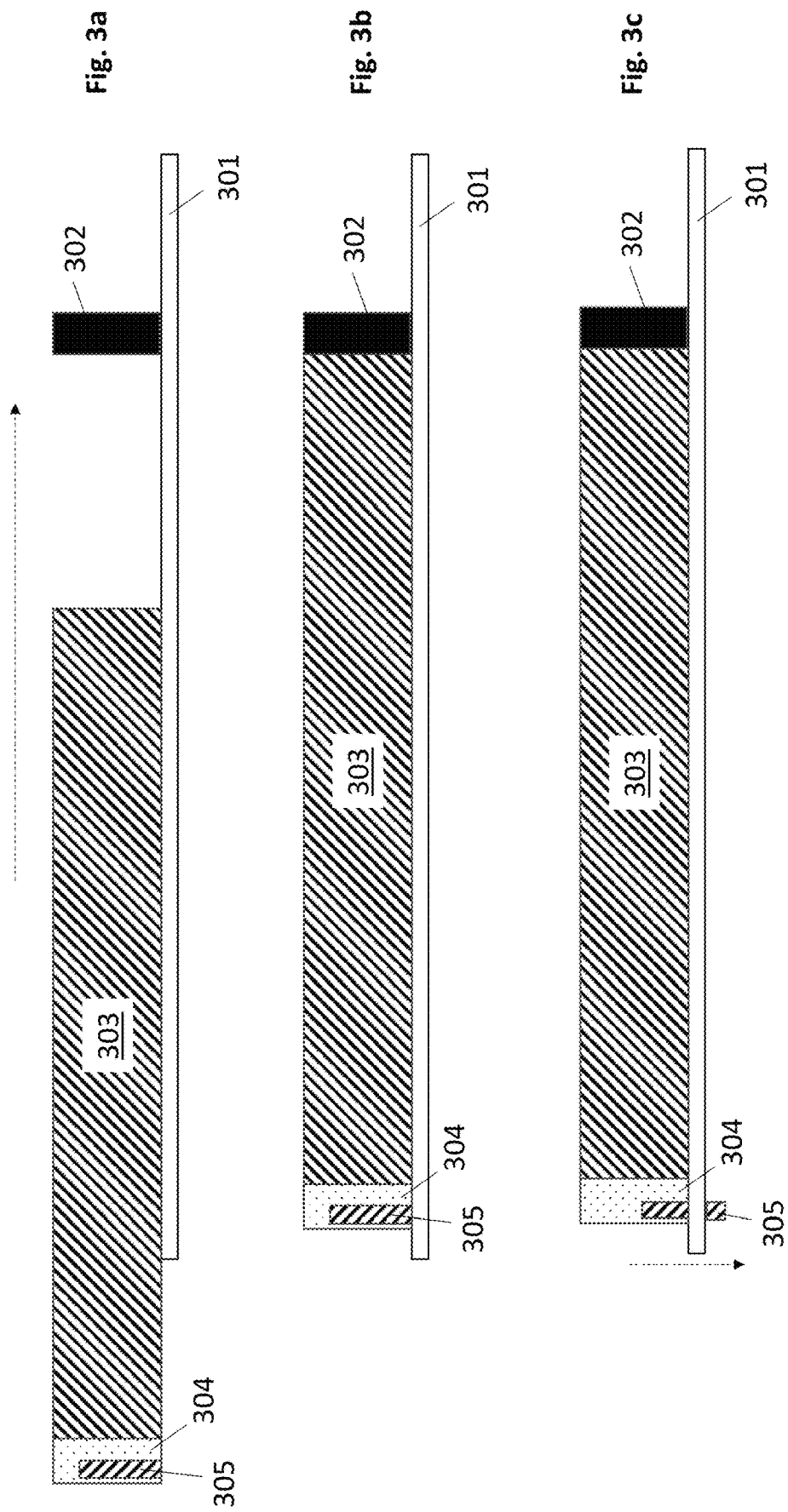

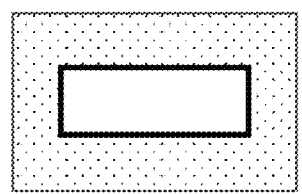
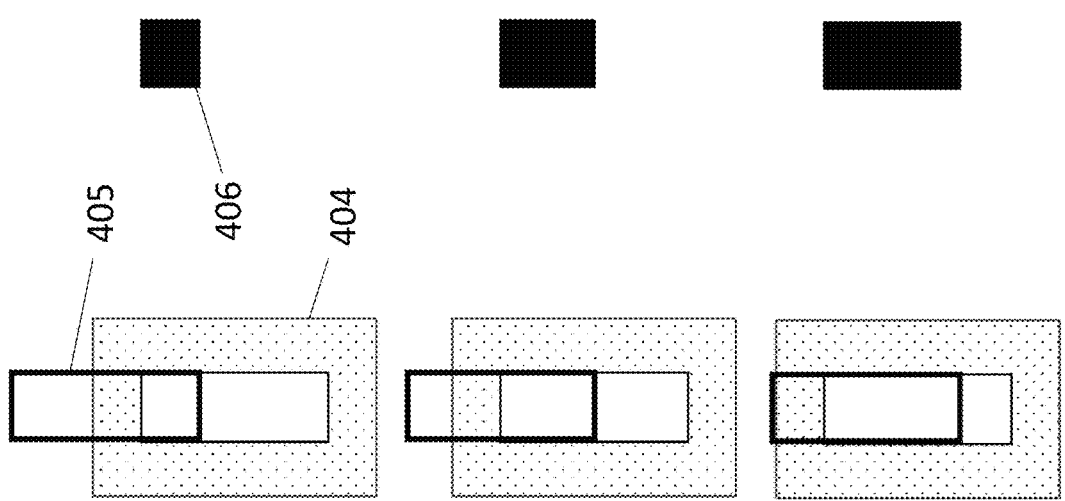

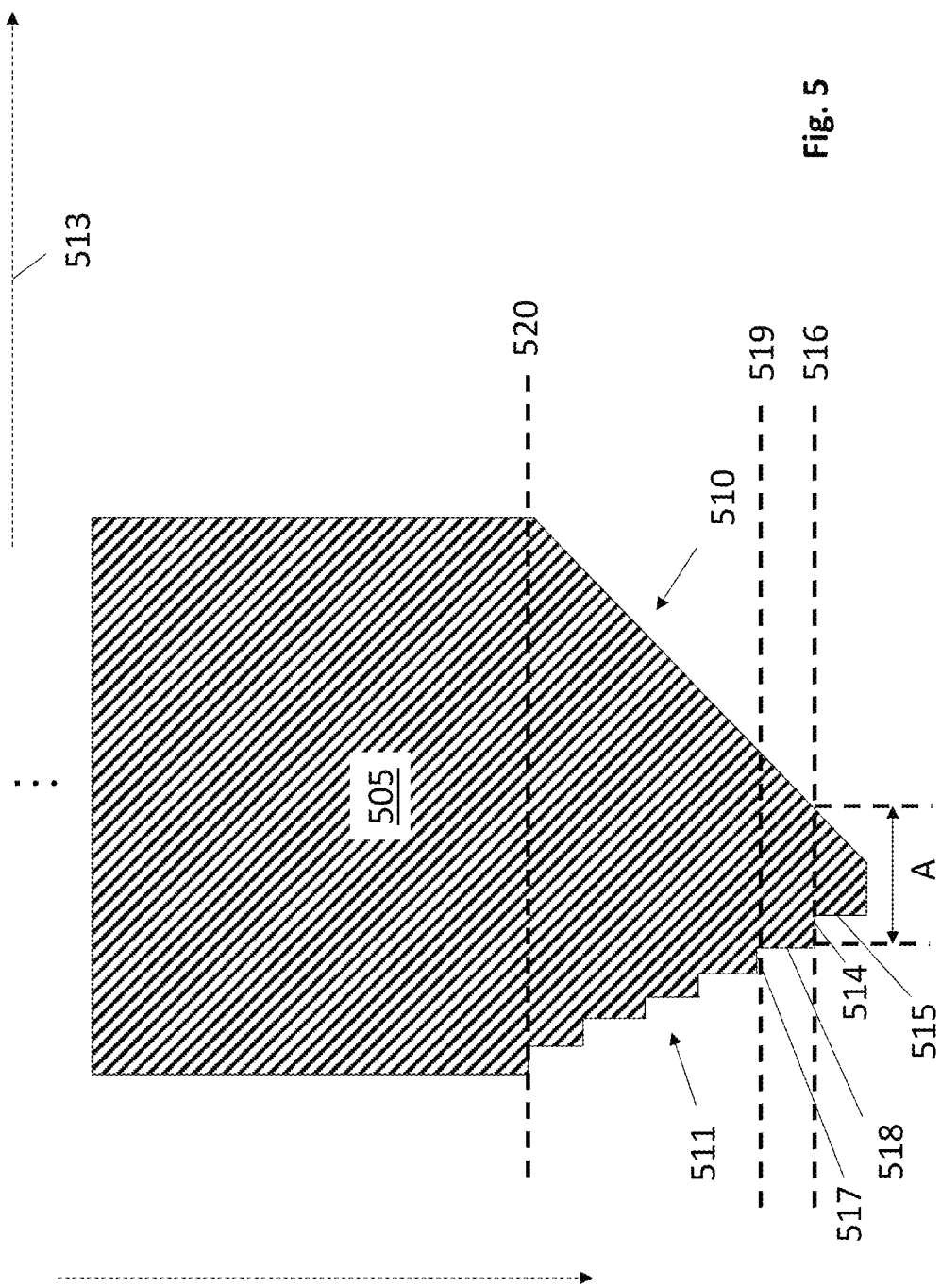

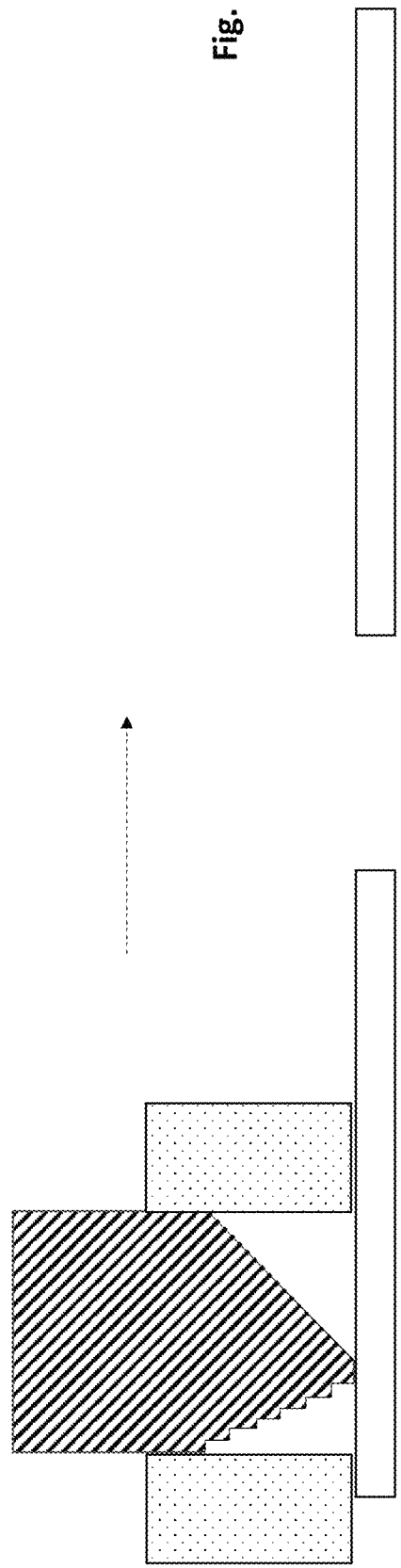

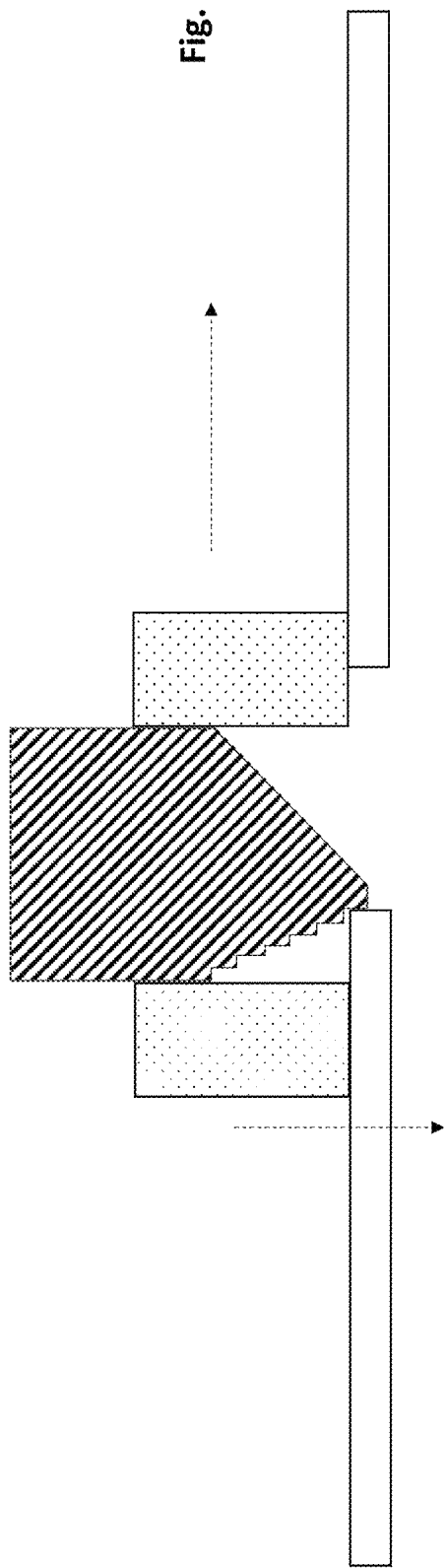
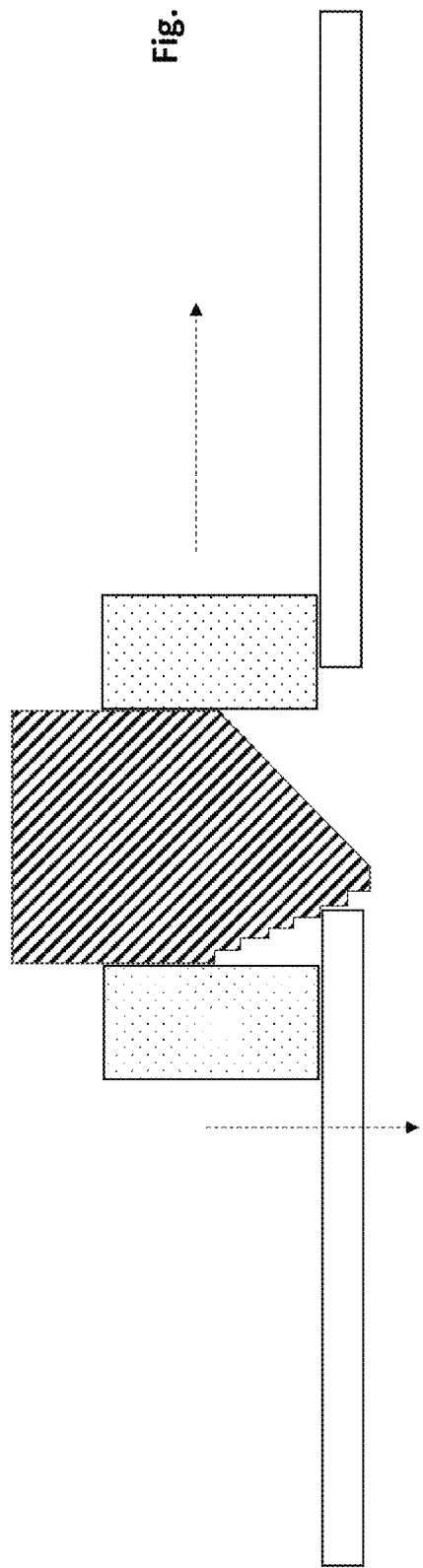

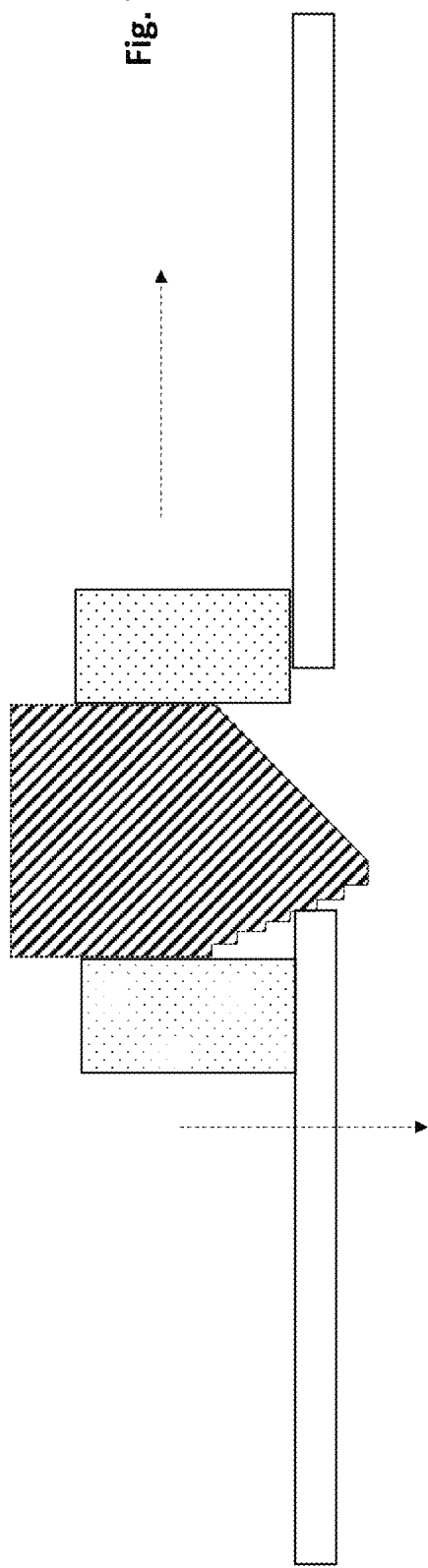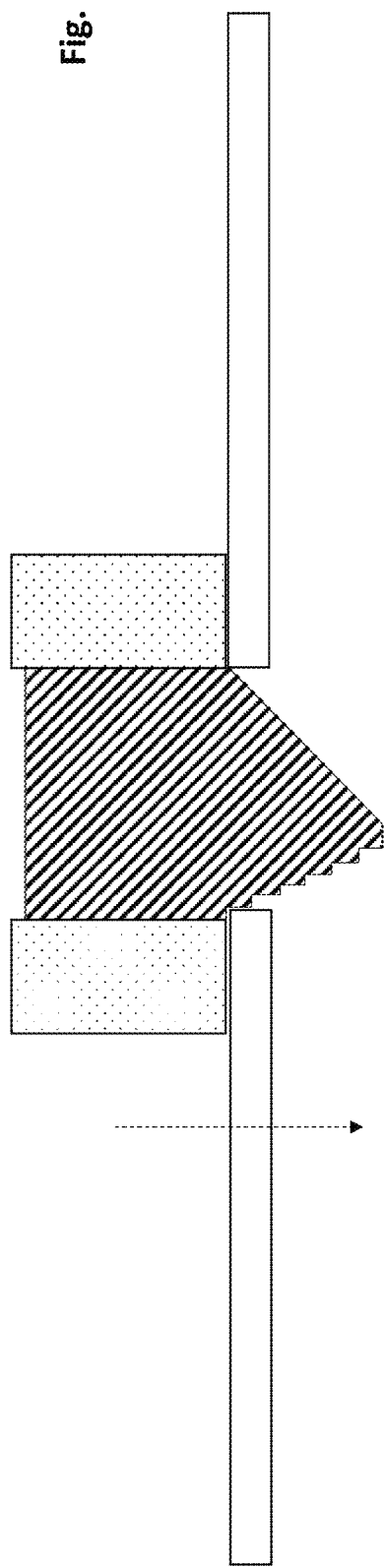

JAM FOR INTEGRATION RELIABILITY OF RULER FORM FACTOR COMPONENT

BACKGROUND

With the onset of cloud computing and big data, system administrators are increasingly looking for new ways to pack as much functionality into as small a space as is practicable. However, increasingly difficult component integration challenges, particularly with respect to plug-able component integration, present themselves when trying to maximize functionality and minimize space consumption.

FIGURES

A better understanding of the present invention can be obtained from the following detailed description in conjunction with the following drawings, in which:

FIGS. 3a, 3b, 3c depict a ruler form factor SSD being plugged into a system;

FIGS. 4a, 4b, 4c and 4d depict different disagrees of misalignment between a housing at the back of a ruler form factor SSD and an opening in a system floor that the ruler form factor SSD slides along when being plugged into the system;

FIG. 5 shows a jam that prevents a SSD from un-plugging from a system even if misalignment exists between the jam's housing and an opening in a system floor;

FIG. 6 shows movement of a housing of a ruler form factor SSD as the SSD is being plugged into the system;

FIGS. 7a, 7b, 7c and 7d show a jam projecting through a hole in a system floor for different amounts of misalignment between the jam's housing and the hole;

DETAILED DESCRIPTION

Figure 1:
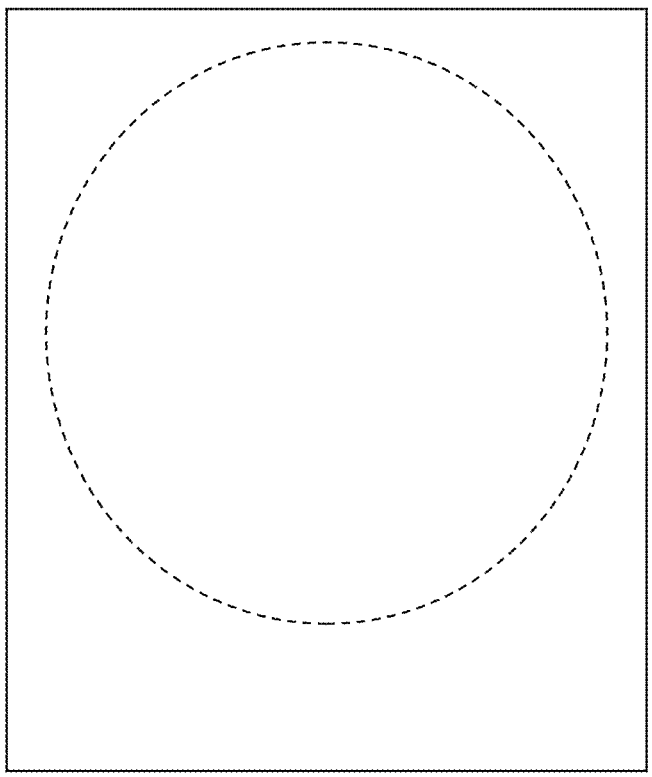
FIG. 1 shows an HDD form factor footprint (prior art)

Traditionally, non volatile mass storage devices have been implemented as hard disk drives (HDDs). In the case of an HDD, one or more rotating disks coated with magnetic storage material are used to store information. In order to house the disk(s), referring to FIG. 1, the form factor for an HDD, such as a 2.5 inch drive, is square-like. Over the past decade or so, solid state drives (SSDs) have made significant inroads as replacements for HDDs. SSDs are non volatile mass storage devices that use non volatile memory chips (e.g., flash memory chips), rather than rotating disk(s), as the underlying storage technology.

Because SSDs started out as replacements for HDDs, initial SSD solutions were packaged in the same square-like form factor as HDDs (e.g., "U2" form factor SSDs). However, the square-like form factor is inefficient in terms of maximizing the amount of non volatile storage that can be packed in a system (assuming the non volatile storage is to be implemented with semiconductor chips and not disk drives).

Figure 2:
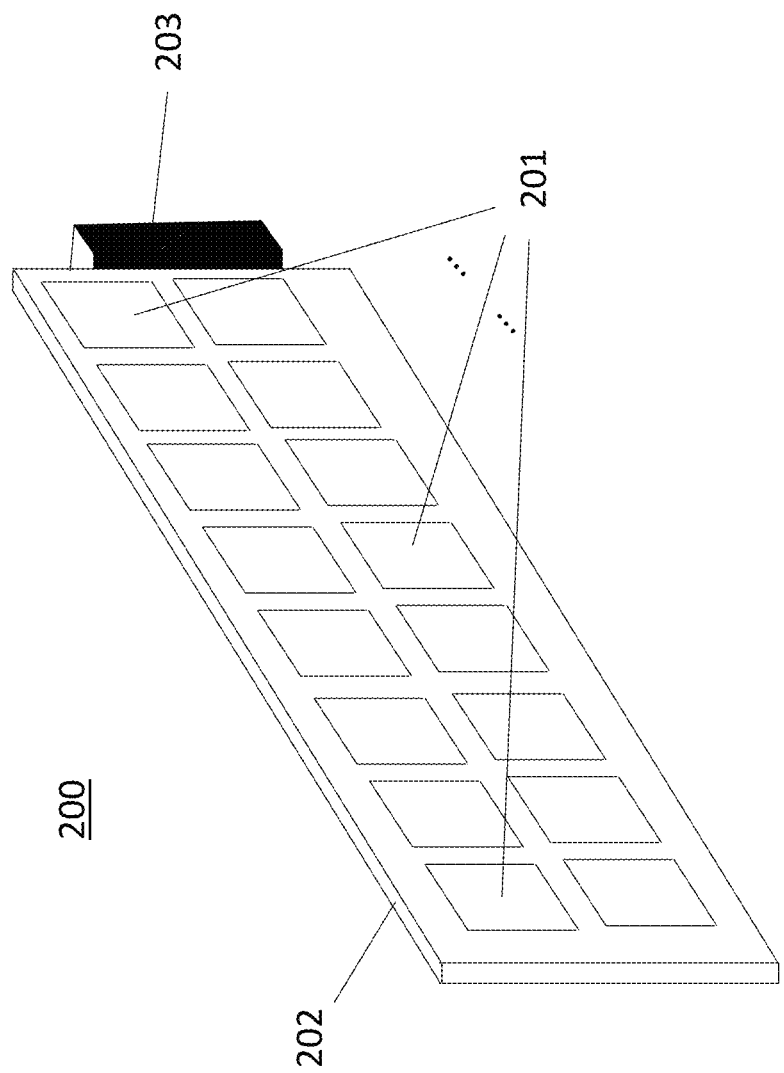
FIG. 2 shows a ruler form factor SSD (prior art)

FIG. 2 shows a more recent SSD form factor approach that is being promulgated by the Enterprise and Data Center Form Factor (EDSFF) Working Group. As observed in FIG. 2, according to the EDSFF approach, an SSD is packaged in the shape of a "ruler". A ruler 200 consists of a number of semiconductor chips 201 mounted to a printed circuit board 202 and an electrical connector 203 that is mounted at a far edge of the printed circuit board 202. The semiconductor chips are disposed along the long, run length of the ruler. The thickness of the ruler largely corresponds to the height of the chip packages and the thickness of the printed circuit board they are mounted to.

The form factor shape of a ruler includes a length that is at least 1.8 times its width. For example, EDSFF ruler form factors include dimensions of 38.4 mm×318.75 mm ("ELL") or 76 mm×142.2 mm ("E31"). A number of Next Generation Form Factor (NGFF) solutions, also known as "M2", also offer a ruler shaped form factor (e.g., 22 m×80 mm and 22 mm×110 mm).

Consistent with the concept of a ruler, a mass storage device embodied in a ruler form factor has a relatively thin height or thickness as compared to the dimensions of its width and length (e.g., thickness is less than half of the ruler's smallest width/length dimension). For example, EDSFF ruler solutions have thicknesses of only 7.5 mm and 16.8 mm while M2 ruler solutions have thicknesses of only 1.3 mm, 2.23 mm and 3.88 mm.

Here, the small thicknesses of ruler solutions allow large numbers of rulers to be closely packed "side-by-side" in a computing system such as a sled server or other rack mountable computer, computing component or networking system. One aspect of the mechanical design of a ruler form factor SSD is the mechanism used to ensure that the ruler does unplug from the system after it is plugged into the system.

FIGS. 3a through 3c show a design for a ruler form factor SSD that includes a "jam" at the back end of the SSD. Referring to FIG. 3a, the ruler form factor SSD 303 has a mechanical housing 304 and a spring loaded jam 305 within the housing 304. Here, the SSD 303 is aligned with a desired SSD slot in the system and is pushed toward an electronic connector 302 deeper within the system. As the SSD 303 approaches the connector 302, the SSD slides on a floor 301 that can include any/all of: 1) the chassis of the system that the SSD is being plugged into; 2) a mechanical component that is fixed to and/or extends from the chassis; and/or, 3) the motherboard of the system.

As the SSD 303 slides on the floor 301, the bottom side of the jam 305 runs along the surface of the floor 301 within the housing 304. Here, there is a slot or opening in the bottom of the housing 304 that the jam 305 can poke out of. Additionally, the jam 305 is spring loaded within the housing 304 so that there exists a continuous force that attempts to push the jam 305 out of the opening at the bottom of the housing 304 when the jam 305 is fully within the housing 304 (the spring is compressed when the jam 305 is fully within the housing 304). However, while the SSD 302 is sliding along the floor 301 toward the connector 302, the floor 301 is flush against the opening at the bottom of the housing 304 which, in turn, prevents the jam 305 from extending out of the opening.

Eventually, as observed in FIG. 3b, the SSD 303 reaches the connector 302 and plugs into it. Ideally, as observed in FIG. 3c, when the SSD 303 is plugged into the electrical connector 302, the slot or opening at the bottom of the housing 304 is aligned with a corresponding slot or opening in the floor 301 (not depicted in FIGS. 3a-c for illustrative ease). Assuming the slot/opening in the floor 301 aligns with the slot/opening in the bottom of the housing 304, the jam 305 is free to extend into the slot/opening in the floor 301. With the jam 304 extending out of the housing 304 and into the slot/opening in the floor 301, ideally, the SSD is incapable of unplugging from the connector 302 and/or sliding out of the system. That is, the extended jam 305 prevents backward movement of the SSD 303.

A problem, however, is that when the SSD 303 is plugged into the connector 302 the slot/opening at the bottom of the housing is often not aligned with the slot/opening in the floor 301. The misalignment can be due to any/all of: 1) the position of the connector 302 relative to the floor 301; 2) the width of the connector 302; 3) the length of the SSD 303; 4) the position of the housing 304 relative to the SSD 303; 5) the size/position of the opening at the bottom of the housing 304; and, 6) the size/position of the opening in the floor 301, etc.

A solution is to "design for" such misalignment coupled with a special designed jam that can fit into whatever sized opening exists beneath it when the SSD is fully plugged into the connector. FIGS. 4*a* through 4*d* show a design approach where one possible misalignment extreme is depicted in FIG. 4*a*, and, another misalignment extreme is depicted in FIG. 4*d*. Each of FIGS. 4*a* through 4*d* show a "top-down" view that depicts both the housing 404 and an outline 405 of the opening in the floor.

Here, if all the aforementioned tolerances are at their minimum so that the opening at the bottom of the SSD housing 404 pushes forward a maximum possible distance, the alignment of FIG. 4*a* results. By contrast, if all the aforementioned tolerances are at their maximum so that the opening at the bottom of the SSD housing 404 pushes forward a minimum distance, the alignment of FIG. 4*d* results. As can be seen in FIGS. 4*a* through 4*d*, the size of the total opening 406 through both the housing 404 and the floor 405 changes as a function of the alignment between the housing 404 and the floor 405.

FIGS. 5, 6 and 7*a* through 7*d* depict a jam that self adjusts its width to fit in any of the total openings 406 of FIGS. 4*a* through 4*d*. FIG. 5 shows the improved tip in detail. FIG. 6 shows the improved tip approaching the opening in the floor as the SSD slides toward the connector. FIGS. 7*a* through 7*d* show final alignments of the housing and floor openings that correspond to the alignments of FIGS. 4*a* through 4*d*.

As can be seen in FIG. 5, the jam tip 505 includes both a ramped linear edge 510 and a toothed trailing edge 511. When the SSD is pushed toward the electrical connector in direction 513, as observed in FIG. 6, the leading edge 510 is ahead of the trailing edge 511 as the bottom of the tip 505 slides across the floor. Eventually, the opening in the floor appears beneath the jam tip. The ramped leading edge 510, combined with the spring force, causes the tip to press into the emerging opening in the floor.

Owing to the tip's toothed trailing edge 511, however, the progression of the jam tip into the widening opening occurs in discrete steps. Here, it is pertinent to recognize that although FIGS. 4*a* through 4*d* were originally presented as different kinds of final alignment after the SSD has been plugged into the electrical connector, they can also be viewed as the timewise "in order" succession of the formation of the opening beneath the jam tip as the SSD is moved forward toward the connector.

That is, for any of FIGS. 4*b* through 4*d*, as the SSD slides forward toward the electrical connector, the opening beneath the tip must present itself as the succession of figures that preceded it (the opening of FIG. 4*b* was preceded in time by the opening in FIG. 4*a*; the opening of FIG. 4*c* was preceded in time by the opening in FIG. 4*a* and then the opening in FIG. 4*b*; the opening of FIG. 4*d* was preceded in time by the opening in FIG. 4*a* and then the opening in FIG. 4*b* and then the opening in FIG. 4*c*).

Here, as the jam tip initially pushes (in response to the spring) through the opening in the floor of FIG. 4*a*, its progression through the opening will be stopped by the pressing of the first step 514 of the jam's trailing edge against the back edge of the floor opening. That is, the jam tip will stop its progression through the opening with the surface of the floor being at level 516. This state is observed in FIG. 7*a*.

Importantly, if the SSD is plugged into the connector as of the alignment of FIG. 4*a*/7*a*, the engagement (e.g., "bite") of the first step 514 against the back edge of the floor opening locks the tip in place which, in turn, prevents backward motion (unplug-ability) of the SSD (face 515 of the tip will press against the inner, back face of the floor opening).

If instead the SSD continues to slide forward as of the state of FIGS. 4*a*/7*a*, when the width of the total opening in the floor beneath the tip expands to length A, the downward force of the spring will cause the jam tip to push further through the opening but then be stopped by the pressing of the second step 517 against the back edge in the floor opening. That is, the jam tip will stop its progression through the widened opening with the surface of the floor being at level 519. This state is observed in FIGS. 4*b* and 7*b*.

Again, if the SSD is plugged into the connector as of the alignment of FIG. 4*b*/7*b*, the engagement (e.g., "bite") of the second step 517 against the back edge of the floor opening locks the tip in place which, in turn, prevents backward motion (unplug-ability) of the SSD (face 518 of the tip will press against the inner, back face of the floor opening).

If instead the SSD continues to slide forward as of the state of FIGS. 4*b*/7*b*, after the width of the opening becomes large enough for the next increment in downward progression, the tip will progress through the opening until it is stopped by the next step. This state is observed in FIGS. 4*c*/7*c*. Again, if the SSD is plugged into the connector, backward motion of the SSD is prevented.

If the SSD continues to move forward, each successive widening of the opening will be met by a unit progression of the tip through the opening. If a worst case misalignment is reached (the SSD moves the maximum amount forward), the tip will fully progress through the maximum width opening. This state is observed in FIGS. 4*d* and 7*d*. Note that the opening in the floor can be smaller than the opening in the housing to ensure that there is surface area of the floor for the jam to engage with the floor when the extreme alignment of FIGS. 4*d* and 7*d* exists.

Figure 8:
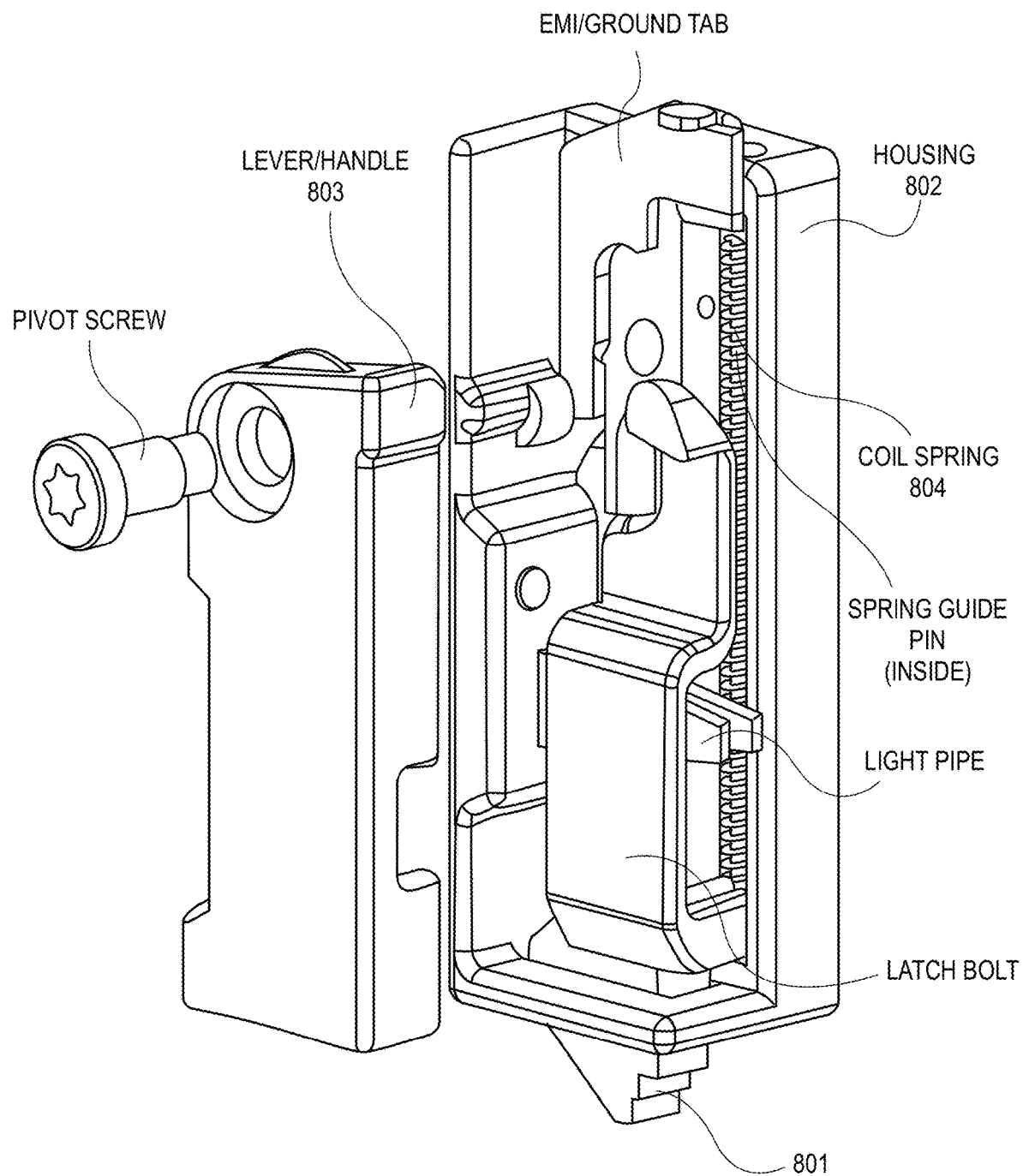
FIG. 8 shows an exploded view of a housing assembly.

FIG. 8 shows an exploded view of one embodiment of the housing assembly. Here, the tip 801 can be observed extending through the opening at the bottom of the housing 802. According to one embodiment, a spring 804 pushes the tip 801 downwards. When the lever 803 is closed, the tip extends through the opening in the housing unless an external force pushes it back into the housing. The spring 804 and the tip 801 are free to move as needed. For example, when the ruler is initially inserted into the chassis with the lever 803 closed, the latch tip (which is protruding from the bottom of the housing) retracts into the housing as the tip 801 begins to slide across the floor. Then, as the hole in the floor emerges beneath the bottom of the housing, and with the lever 803 remaining closed, the tip is able to protrude from the bottom of the housing and extend into the hole.

When the lever 803 is opened, it lifts the tip 801, causing it to retract into the housing 802. With the tip 801 retracted into the housing, the open lever 803 can be used as a handle to remove the ruler from the system.

In other embodiments, the spring loaded mechanism may be designed to achieve a positive hold jam that enhances friction to the floor opening edge through high normal forces applied by the spring or spring and lever.

Moreover, although embodiments above have stressed the jam is located internal to a ruler form factor housing, it is conceivable that the mechanism in whole or in part could exist outside of the ruler housing but within the ruler form factor envelope. For example, a notch could be formed in the back end of the ruler housing/chassis/cover and the jam sits in the notch, external from the housing/chassis/cover so that it is visible to a user when the ruler is fitted with its housing/chassis/cover.

In various extended embodiments, the top and/or inner surface of the floor on and/or within the hole in the floor is composed of metal that is electrically grounded. The tip and housing are also composed of metal. When the SSD is plugged into the connector and the tip is engaged with the opening in the floor, the engagement is used to ground the housing and the SSD.

Although embodiments above have stressed SSDs with ruler form factors, it is conceivable that pluggable components other than SSDs may posses a ruler form factor and make use of the teachings described above. In particular, emerging non volatile memory technologies are capable of byte addressability and/or have read and/or write access times that are comparable with dynamic random access memory (DRAM) or are otherwise significantly faster than flash memory. In some embodiments, the storage cells of an emerging non volatile memory device comprise a transistor-less stackable cross point architecture in which memory cells sit at the intersection of word lines and bit lines and are individually addressable and in which bit storage is based on a change in bulk resistance. As a consequence, such emerging non volatile memory is being used for true memory purposes (e.g., main memory) rather than mass storage purposes. Alternatively or in combination, emerging non volatile memory devices can be integrated into an SSD as a replacement for flash in a mass storage device.

Moreover, functions completely other than storage/memory may be pluggable into a system and therefore can entertain the use of a ruler form factor and therefore the techniques described above. Examples include accelerator rulers (e.g., a graphics processing unit (GPU) ruler, a neural network ruler, an "XPU" ruler, etc.) and network interface adaptors to name just a few.

Further still, other plug-able components that do not have a ruler form factor can make use of the teachings described just above. Even further, the opening and jam need not necessarily be integrated with a "floor" as such structures can alternatively be integrated on the side ("wall") of a pluggable component or top ("ceiling") of a pluggable component (that is, a surface more generally).

Although embodiments above have stressed a server system having one or more processors (CPUs), it is pertinent to point out that any, e.g., high density large scale semiconductor chip could be disposed on a motherboard (e.g., system-on-chip, accelerator chip (e.g., neural network processor), graphics processing unit (GPU), general purpose graphics processing unit (GPGPU), field programmable gate array (FPGA), application specific integrated circuit (ASIC)), an "X" processing unit ("XPU") where "X" can be any processor other than a general purpose processor (e.g., etc. G for graphics, D for data, I for infrastructure, etc.).

Any chassis discussed above can have dimensions that are compatible with an industry standard rack (such as racks having 19" or 23" widthwise openings and having mounting holes for chassis having heights of specific height units (e.g., 1 U, 2 U, 3 U where U=1.75"). One example is the IEC 60297 Mechanical structures for electronic equipment—Dimensions of mechanical structures of the 482.6 mm (19 in) series. Generally, however, a chassis of any dimension is possible.

The electrical I/Os of the ruler to motherboard connections described above (or input/output interfaces between the rack and chassis described above) may be compatible with or used to transport signals associated with various data center computing and networking system interconnect technologies. Examples include, e.g., data and/or clocking signals associated with any of Infinity Fabric (e.g., as associated and/or implemented with AMD products) or derivatives thereof, specifications developed by the Cache Coherent Interconnect for Accelerators (CCIX) consortium or derivatives thereof, specifications developed by the GEN-Z consortium or derivatives thereof, specifications developed by the Coherent Accelerator Processor Interface (CAPI) or derivatives thereof, specifications developed by the Compute Express Link (CXL) consortium or derivatives thereof, specifications developed by the Hyper Transport consortium or derivative thereof, Ethernet, Infiniband, NVMe-oF, PCIe, etc.

The chassis described above may contain the primary components of an entire computer system (e.g., CPU, main memory controller, main memory, peripheral controller and mass non-volatile storage), or, may contain the functionality of just some subset of an entire computer system (e.g., a chassis that contains primarily CPU processor power, a chassis that contains primarily main memory control and main memory, a chassis that contains primarily a storage controller and storage). The later can be particularly useful for dis-aggregated computing systems.

In the case of a dis-aggregated computer system, unlike a traditional computer in which the core components of a computing system (e.g., CPU processors, memory, storage, accelerators, etc.) are all housed within a common chassis and connected to a common motherboard, such components are instead integrated on separate pluggable cards or other pluggable components (e.g., a CPU card, a system memory card, a storage card, an accelerator card, etc.) that plug-into a larger exposed backplane or network instead of a same, confined motherboard. As such, for instance, CPU computer power can be added by adding CPU cards to the backplane or network, system memory can be added by adding memory cards to the backplane or network, etc. Such systems can exhibit even more high speed card to card connections that traditional computers. One or more dis-aggregated computers and/or traditional computers/servers can be identified as a Point of Delivery (PoD) for computing system function in, e.g., the larger configuration of an information technology (IT) implementation such as a data center.

Figure 9:
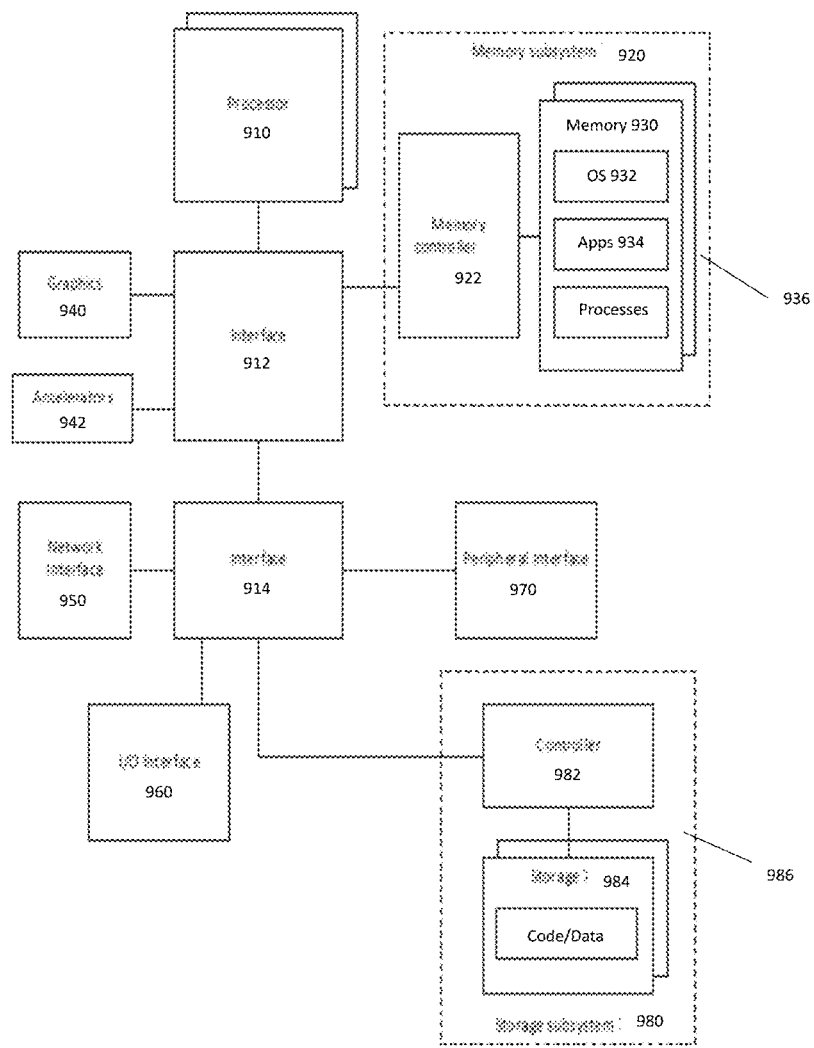
FIG. 9 shows a system.

FIG. 9 depicts an example system. The system can use embodiments described herein to determine a reference voltage to apply to a rank of memory devices and a timing delay of a chip select (CS) signal sent to the rank of memory devices. System 900 includes processor 910, which provides processing, operation management, and execution of instructions for system 900. Processor 910 can include any type of microprocessor, central processing unit (CPU), graphics processing unit (GPU), processing core, or other processing hardware to provide processing for system 900, or a combination of processors. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 900 includes interface 912 coupled to processor 910, which can represent a higher speed interface or a high throughput interface for system components that needs higher bandwidth connections, such as memory subsystem 920 or graphics interface components 940, or accelerators 942. Interface 912 represents an interface circuit, which can be a standalone component or integrated onto a processor die. Where present, graphics interface 940 interfaces to graphics components for providing a visual display to a user of system 900. In one example, graphics interface 940 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 940 generates a display based on data stored in memory 930 or based on operations executed by processor 910 or both. In one example, graphics interface 940 generates a display based on data stored in memory 930 or based on operations executed by processor 910 or both.

Accelerators 942 can be a fixed function offload engine that can be accessed or used by a processor 910. For example, an accelerator among accelerators 942 can provide compression (DC) capability, cryptography services such as public key encryption (PKE), cipher, hash/authentication capabilities, decryption, or other capabilities or services. In some embodiments, in addition or alternatively, an accelerator among accelerators 942 provides field select controller capabilities as described herein. In some cases, accelerators 942 can be integrated into a CPU socket (e.g., a connector to a motherboard or circuit board that includes a CPU and provides an electrical interface with the CPU). For example, accelerators 942 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 942 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 920 represents the main memory of system 900 and provides storage for code to be executed by processor 910, or data values to be used in executing a routine. Memory subsystem 920 can include one or more memory devices 930 such as read-only memory (ROM), flash memory, volatile memory, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 900 includes interface 914, which can be coupled to interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can transmit data to a remote device, which can include sending data stored in memory. Network interface 950 can receive data from a remote device, which can include storing received data into memory. Various embodiments can be used in connection with network interface 950, processor 910, and memory subsystem 920.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (e.g., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (e.g., the value or state of the data is indeterminate if power is interrupted to system 900). In one example, storage subsystem 980 includes controller 982 to interface with storage 984. In one example controller 982 is a physical part of interface 914 or processor 910 or can include circuits or logic in both processor 910 and interface 914.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 900. More specifically, power source typically interfaces to one or multiple power supplies in system 1100 to provide power to the components of system 900. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 900 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 10:
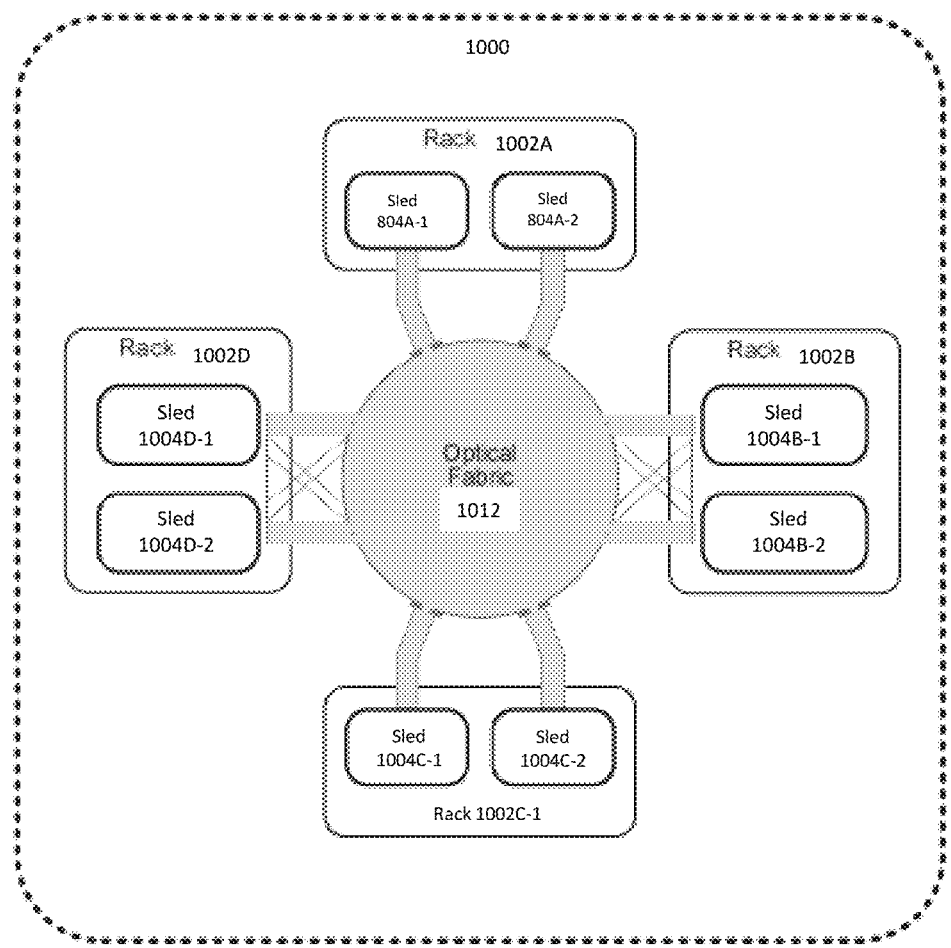
FIG. 10 shows a data center.

FIG. 10 depicts an example of a data center. Various embodiments can be used in or with the data center of FIG. 10. As shown in FIG. 10, data center 1000 may include an optical fabric 1012. Optical fabric 1012 may generally include a combination of optical signaling media (such as optical cabling) and optical switching infrastructure via which any particular sled in data center 1000 can send signals to (and receive signals from) the other sleds in data center 1000. However, optical, wireless, and/or electrical signals can be transmitted using fabric 1012. The signaling connectivity that optical fabric 1012 provides to any given sled may include connectivity both to other sleds in a same rack and sleds in other racks. Data center 1000 includes four racks 1002A to 1002D and racks 1002A to 1002D house respective pairs of sleds 1004A-1 and 1004A-2, 1004B-1 and 1004B-2, 1004C-1 and 1004C-2, and 1004D-1 and 1004D-2. Thus, in this example, data center 1000 includes a total of eight sleds. Optical fabric 1012 can provide sled signaling connectivity with one or more of the seven other sleds. For example, via optical fabric 1012, sled 1004A-1 in rack 1002A may possess signaling connectivity with sled 1004A-2 in rack 1002A, as well as the six other sleds 1004B-1, 1004B-2, 1004C-1, 1004C-2, 1004D-1, and 1004D-2 that are distributed among the other racks 1002B, 1002C, and 1002D of data center 1000. The embodiments are not limited to this example. For example, fabric 1012 can provide optical and/or electrical signaling.

Figure 11:
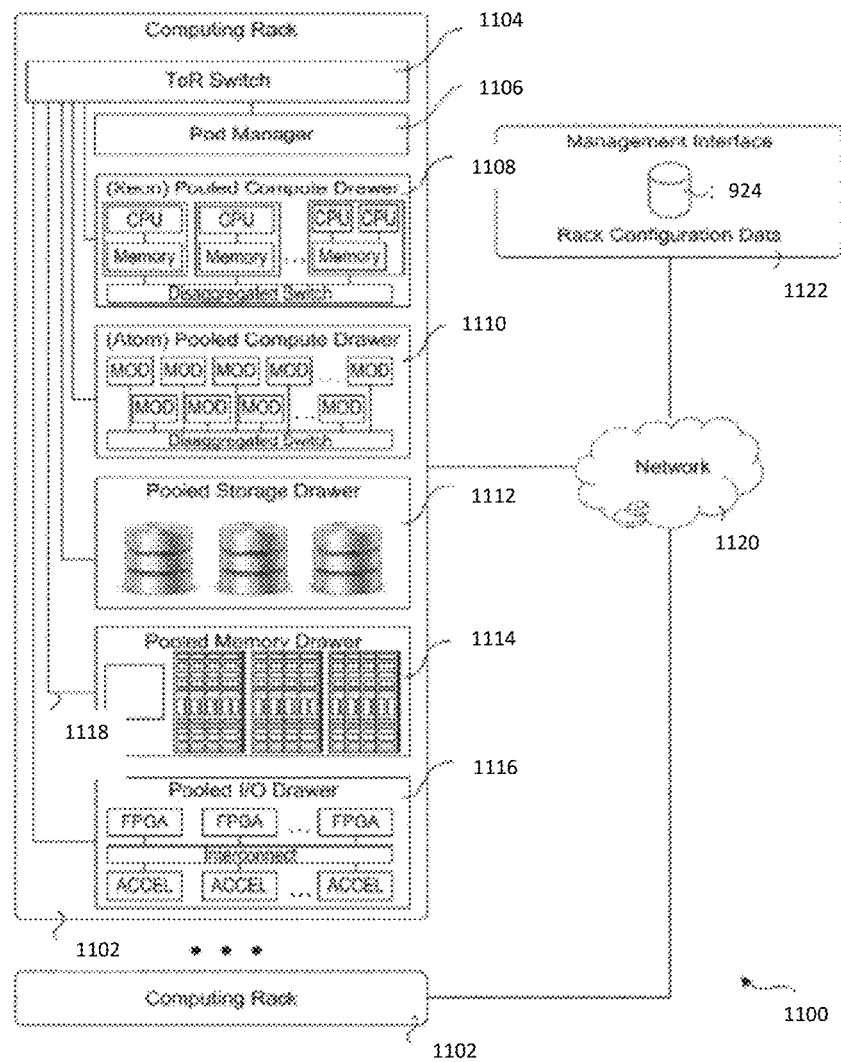
FIG. 11 shows a rack mounted computing environment.

FIG. 11 depicts an environment 1100 includes multiple computing racks 1102, each including a Top of Rack (ToR) switch 1104, a pod manager 1106, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 1108, and INTEL® ATOM™ pooled compute drawer 210, a pooled storage drawer 212, a pooled memory drawer 214, and an pooled I/O drawer 1116. Each of the pooled system drawers is connected to ToR switch 1104 via a high-speed link 1118, such as a 40 Gigabit/second (Gb/s) or 100 Gb/s Ethernet link or an 100+Gb/s Silicon Photonics (SiPh) optical link. In one embodiment high-speed link 1118 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 1100 may be interconnected via their ToR switches 1104 (e.g., to a pod-level switch or data center switch), as illustrated by connections to a network 1120. In some embodiments, groups of computing racks 1102 are managed as separate pods via pod manager(s) 1106. In one embodiment, a single pod manager is used to manage all of the racks in the pod. Alternatively, distributed pod managers may be used for pod management operations.

RSD environment 1100 further includes a management interface 1122 that is used to manage various aspects of the RSD environment. This includes managing rack configuration, with corresponding parameters stored as rack configuration data 1124.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
an electronic component to be plugged into an electronic system, the electronic component comprising a jam, the jam to extend into an opening in a surface within the electronic system when the jam is aligned with the opening, the surface being a mechanical component of the electronic system that the electronic component is to slide upon when being plugged into the electronic system, the jam comprising tooth edges to engage with an edge of the opening, wherein the jam is composed of electrically conductive material and is to electrically ground the electronic component when the tooth edges engage with the edge of the opening.

2. The apparatus of claim 1 wherein the electronic component is a ruler form factor solid state drive.

3. The apparatus of claim 1 wherein the jam is coupled to a spring, the spring to provide a force that causes the jam to push through the opening.

4. The apparatus of claim 1 wherein the jam is within a housing that comprises a handle having a closed position to engage the electronic component with the electronic system, the jam able to retract within and protrude from another opening in the housing when the handle is in the closed position.

5. The apparatus of claim 1 wherein the jam comprises a leading edge and a trailing edge, wherein, the tooth edges reside along the trailing edge.

6. The apparatus of claim 1 wherein the surface is a floor within the electronic system.

7. An electronic system, comprising:
an electrical connector;
a ruler form factor component that is plugged into the electrical connector;
a surface upon which the ruler form factor was slid upon when the ruler form factor component was being plugged into the electrical connector, the ruler form factor component comprising a housing, the housing comprising a jam, the jam pushing through a first opening in the housing and a second opening in the surface, the jam comprising tooth edges that are engaged with an edge of the second opening.

8. The electronic system of claim 7 wherein the ruler form factor component is a solid state drive.

9. The electronic system of claim 7 wherein the housing also comprises a spring, the spring providing a force that pushes the jam through the first and second openings.

10. The electronic system of claim 9 wherein the housing comprises a handle having a closed position to engage the ruler form factor component with the electronic system, the jam able to retract within and protrude from the first opening when the handle is the closed position.

11. The electronic system of claim 7 wherein the jam comprises a leading edge and a trailing edge, wherein, the tooth edges reside along the trailing edge.

12. The electronic system of claim 7 wherein the first opening is at a bottom of the housing and the surface is a floor within the electronic system.

13. The electronic system of claim 7 wherein the jam is composed of electrically conductive material and is to electrically ground the ruler form factor component.

14. A data center, comprising:
a plurality of racks that are communicatively coupled at least partially by an optical fabric;
a plurality of sleds plugged into the racks to implement any of pooled memory resources, pooled storage resources and pooled compute resources, wherein, at least one of the sleds comprise i), ii) and iii) below:
i) an electrical connector;
ii) a ruler form factor component that is plugged into the electrical connector;
iii) a surface upon which the ruler form factor was slid upon when the ruler form factor component was being plugged into the electrical connector, the ruler form factor component comprising a housing, the housing comprising a jam, the jam pushing through a first opening in the housing and a second opening in the surface, the jam comprising tooth edges that are engaged with an edge of the second opening.

15. The data center of claim 14 wherein the ruler form factor component is a solid state drive.

16. The data center of claim 14 wherein the housing also comprises a spring, the spring providing a force that pushes the jam through the first and second openings.

17. The data center of claim 16 wherein the housing comprises a handle having a closed position to engage the ruler form factor component with a sled, the jam able to retract within and protrude from the first opening when the handle is the closed position.

18. The data center of claim 14 wherein the jam comprises a leading edge and a trailing edge, wherein, the tooth edges reside along the trailing edge.

19. The data center of claim 14 wherein the first opening is at a bottom of the housing and the surface is a floor within a chassis of a rack.

20. An apparatus, comprising:
an electronic component to be plugged into an electronic system, the electronic component comprising a jam, the jam to extend into an opening in a surface within the electronic system when the jam is aligned with the opening, the surface being a mechanical component of the electronic system that the electronic component is to slide upon when being plugged into the electronic system, the jam comprising tooth edges to engage with an edge of the opening, wherein the jam is within a housing that comprises a handle having a closed position to engage the electronic component with the electronic system, the jam able to retract within and protrude from another opening in the housing when the handle is in the open position.

\* \* \* \* \*